United States Patent [19]

Wei et al.

[11] Patent Number: 5,506,440

[45] Date of Patent: *Apr. 9, 1996

[54] POLY-BUFFERED LOCOS PROCESS

[75] Inventors: Che-Chia Wei, Singapore, Singapore; Robert L. Hodges, Scottsdale, Ariz.; Frank R. Bryant, Denton, Tex.

[73] Assignee: SGS-Thomson Microelectronics, Inc., Carrollton, Tex.

[*] Notice: The term of this patent shall not extend beyond the expiration date of Pat. No. 5,420,453.

[21] Appl. No.: 270,411

[22] Filed: Jul. 5, 1994

Related U.S. Application Data

[63] Continuation of Ser. No. 809,401, Dec. 18, 1991, abandoned, which is a continuation-in-part of Ser. No. 755,508, Aug. 30, 1991, Pat. No. 5,260,229.

[51] Int. Cl.$^6$ .............................. H01L 29/00; H01L 23/58
[52] U.S. Cl. ........................ 257/506; 257/640; 257/647; 257/649; 437/69
[58] Field of Search ................................ 257/324, 588, 257/640, 506, 647–649; 437/69, 72, 73

[56] References Cited

U.S. PATENT DOCUMENTS

| 4,407,696 | 10/1983 | Han et al. | |
|---|---|---|---|
| 5,130,268 | 7/1992 | Liou et al. | 437/72 |
| 5,159,428 | 10/1992 | Rao et al. | |

FOREIGN PATENT DOCUMENTS

| 0137192 | 8/1984 | European Pat. Off. | |
|---|---|---|---|
| 61-81649 | 4/1986 | Japan | 437/69 |
| 63-288047 | 11/1988 | Japan | |

OTHER PUBLICATIONS

A. Mozu et al., "A Manufacturing Process for Semiconductor Diodes" Kokai 61–81649 (Japan) Apr. 1986 pp. 1–12.

F. H. De La Moneda, "Process to Reduce and Control the P-type Doping Concentration at the Boundary Between Recessed Oxide and Active Device Regions", *IBM Technical Disclosure Bulletin*, vol. 25, (Apr. 1983), pp. 6131–6142.

IEEE Electron Device Letters, vol. 11, No. 11, Nov. 1990 "Reverse L–Shape Sealed Poly–Buffer LOCOS Technology", J. M. Sung, et al., pp. 549–551.

Journal of The Electrochemical Society, vol. 138, No. 7, Jul. 1991, "Twin–White Ribbon Effect and Pit Formation Mechanism in PBLOCOS" Tin–hwang Lin, et al, pp. 2145–2149.

*J. Electrochem. Soc.:* Solid–State Science and Technology, vol. 129, No. 8, Aug. 1982, titled "The Oxidation Inhibition in Nitrogen–Implanted Silicon", by W. J. M. J. Josquin, et al., pp. 1803–1811.

*IEDM, 1989*, pp. 425–428, titled "A 0.5–micron BiCMOS Technology for Logic and 4Mbit–class SRAM's," by R. Eklund, et al.

*Primary Examiner*—J. Carroll
*Attorney, Agent, or Firm*—Lisa K. Jorgenson; Kenneth C. Hill; Richard K. Robinson

[57] ABSTRACT

A method is provided for forming an improved poly-buffered LOCOS process by forming a pad oxide layer over a substrate. A first nitride layer is formed over the pad oxide layer and a polysilicon layer is formed over the first nitride layer. A second nitride layer is formed over the polysilicon layer. An opening is etched through the second nitride layer, the polysilicon layer, the first nitride layer and the pad oxide layer to expose a portion of the underlying substrate. A field oxide region is then formed in the opening.

5 Claims, 1 Drawing Sheet

POLY-BUFFERED LOCOS PROCESS

This is a continuation of application Ser. No. 07/809,401, filed Dec. 18, 1991, abandoned which is a continuation-in-part of application U.S. Ser. No. 755,508 filed Aug. 30, 1991, U.S. Pat. No. 5,260,229, titled METHOD OF FORMING ISOLATED REGIONS OF OXIDE, which has been assigned to the assignee hereof and is incorporated by reference herein.

FIELD OF INVENTION

The present invention relates generally to semiconductor integrated circuits, and more specifically to forming an improved poly-buffered LOCOS structure.

BACKGROUND OF THE INVENTION

The trend to continue to miniaturize semiconductor integrated circuits to achieve submicron feature sizes and increase the number of devices fabricated on the integrated circuit has required smaller isolation areas between devices. The active areas in which devices are built are isolated by a layer of oxide known as field oxide. However, the technology used to isolate active areas has not kept pace with the ever-decreasing device geometries.

Isolation techniques should meet a variety of requirements. First, active areas should be in close proximity. Second, the lateral encroachment or tapering of the field oxide into the active areas, known as "birdbeaking", should be minimized. Third, the leakage current between active devices should be negligible. Fourth, the process for forming the field oxide regions must be easily adapted for use with standard integrated circuit fabrication process flows and not adversely affect device parameters.

Many methods have been proposed over the years to reduce the bird's beak of a field oxide region when isolating devices. One such method of isolating devices, LOCOS, local oxidation of silicon, produces regions of insulating silicon dioxide between devices. The LOCOS process was a great technological improvement in reducing the area needed for the isolation regions and decreasing some parasitic capacitances.

In LOCOS, silicon nitride is deposited and patterned over a stress relief pad oxide layer. The silicon nitride layer is retained over the area over where further oxidation is not desired. Thus, the silicon nitride is etched to expose a portion of the pad oxide where the field oxide is to be grown. After the thermal oxidation of the exposed pad oxide to form the field oxide regions, the silicon nitride layer is removed.

Several problems occurred, however, with LOCOS. Thermal oxidation in the original LOCOS form always incurred lateral encroachment, or birdbeaking, of the field oxide into the active areas growing under the silicon nitride mask. This birdbeaking is a substantial sacrifice of active areas that becomes significant for feature sizes less than 1.5 microns. The active area becomes smaller than the initial dimensions of the nitride layer.

Attempts to suppress birdbeaking in LOCOS, such as forming thicker nitride layers, caused stress-related defects in the nearby substrate due to the difference in the thermal coefficients of expansion between the silicon substrate and the silicon nitride layers. Process complexity also increased substantially in attempting to avoid these stress-related defects. To achieve submicron geometries, there can be little or no physical loss of the active areas as occurs with the birdbeaking phenomenon.

To reduce the bird's beak effect, there has been proposed the use of a polysilicon layer between the nitride layer and the pad oxide layer as more fully described in U.S. Pat. No. 4,407,696, issued Oct. 4, 1983 to Han et al. The use of the polysilicon layer in the LOCOS process, known as poly-buffered LOCOS or PBLOCOS, is used to reduce oxidation induced stacking faults resulting from the stress caused by the different thermal coefficients of expansion between the silicon substrate and a thick silicon nitride layer overlying the substrate. As described more fully in the publication "Twin-White-Ribbon Effect and Pit Formation Mechanism in PBLOCOS", J. Electrochem. Soc., Vol 138, No. 7, Jul. 1991 by Tin-hwang Lin et al, the polysilicon layer absorbs the excessive stress caused by the silicon nitride and prevents the lateral encroachment of oxidants, thus reducing the bird's beak.

The field oxide layer grown using poly-buffered LOCOS thus comprises the oxide derived from the silicon substrate, a portion of the pad oxide layer and oxide derived from the polysilicon layer. Afterwards, the nitride layer, the polysilicon layer and the pad oxide are etched. The poly-buffered LOCOS process reduces the bird's beak area over standard LOCOS resulting in less encroachment of the tapered portion of the field oxide into the active areas under the nitride mask. However, the bird's beak effect still remains, due to the oxidation of the polysilicon layer.

In order to further decrease the bird's beak area using poly-buffered LOCOS, it has been proposed in an article by J. M. Sung et al, titled "Reverse L-Shape Sealed Poly-Buffer LOCOS Technology," in IEEE, 1990, pages 549–551, to form the pad oxide over the substrate as in the conventional process. A polysilicon layer is formed over the oxide and a silicon nitride layer is formed over the polysilicon. The nitride/polysilicon stack is etched down to the pad oxide. The pad oxide is then selectively etched resulting in lateral undercuts beneath the polysilicon. A new buffer oxide layer is then grown. A nitride spacer is then formed along the sides of the polysilicon and in the area of the lateral undercut. The article indicates that the bird's beak is thus reduced when the field oxide is grown in the active areas because, among other reasons, the polysilicon cannot be oxidized.

The nitride sidewall will reduce the bird's beak but does not prevent the thick nitride layer on top of the polysilicon layer from inducing defects in the silicon substrate. During the formation of the field oxide region in a steam ambient, a chemical reaction takes place in which water molecules react with silicon nitride to form oxide and ammonia. Nitridation occurs in the polysilicon layer due to the ammonia reacting with the polysilicon. The chemical reaction forms silicon nitride pits or defects in the polysilicon. Then, when the nitride layer above the polysilicon is etched away, these silicon nitride pits within the polysilicon are also etched away causing defects or pits in the underlying oxide layer. When the polysilicon is subsequently etched away, the etch step proceeds through the defects in the oxide and are transferred to the substrate.

If a nitride layer is formed between the polysilicon layer and the oxide layer, the pit formations in the polysilicon layer cannot be transferred to the underlying oxide layer. It would be desirable to reduce the bird's beak while also reducing the defects in the oxide layer and the substrate. It would further be desirable to reduce the complexity of the process and be easily adapted for use with standard integrated circuit fabrication process flows.

SUMMARY OF THE INVENTION

The invention may be incorporated into a method for forming an integrated circuit, and the integrated circuit formed thereby, by forming a pad oxide layer over a portion of a substrate. A polysilicon layer is formed over the pad oxide layer wherein the polysilicon layer has silicon nitride on an upper and a lower surface of the polysilicon layer. A field oxide region is formed on a portion of the substrate not covered by the pad oxide layer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
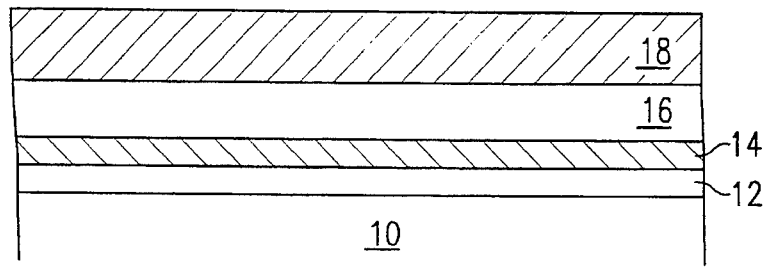
FIGS. 1–5 are cross-sectional views of the fabrication of a semiconductor device structure according to the present invention.

Referring to FIG. 1, an integrated circuit is to be formed on a silicon substrate 10. A stress relief pad oxide layer 12 is grown over the substrate 10. The pad oxide layer 12 will typically have a thickness of between approximately 10 to 300 angstroms. A first silicon nitride layer ($Si_3N_4$) 14 may formed over the oxide layer 12. Layer 14 will typically have a thickness of between approximately 10 to 200 angstroms. Layer 14 may be formed by chemical vapor deposition as is known in the art or by rapid thermal nitridation (RTN) of the oxide layer 12. RTN of the oxide layer will result in a smaller pad oxide layer 12 under the first silicon nitride layer 14.

A polysilicon buffer layer 16 is then deposited over the first silicon nitride layer 14 having a thickness of between approximately 50 to 1000 angstroms. A second silicon nitride layer 18 is deposited over the polysilicon buffer layer 16. The second nitride layer 18 has a thickness of between approximately 500 to 3000 angstroms.

Figure 2:
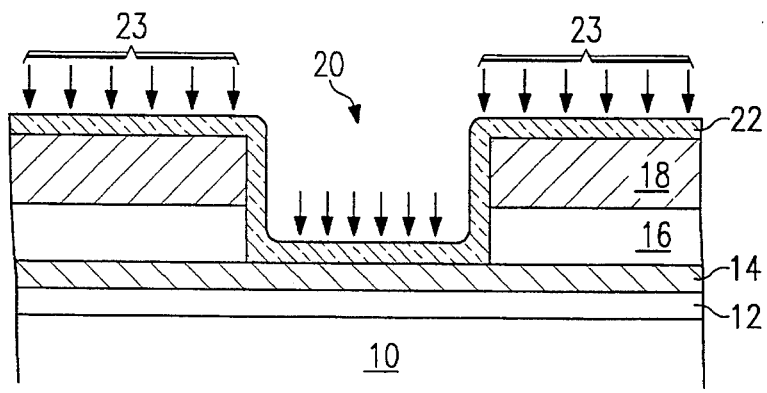

Referring to FIG. 2, an opening 20 is etched through the second silicon nitride layer 18 and the polysilicon layer 16 to define an area in which the isolation or field oxide region is to be manufactured. The opening may be further etched through the first silicon nitride layer 14 and the oxide layer 12. However, there is an advantage in retaining at least the oxide layer 12 in that it acts as an etch stop for the second silicon nitride layer 18 and the polysilicon layer 16.

At this stage, if the first nitride layer 14 is also etched away or if layer 14 and the oxide layer 12 are etched away, an implant into the silicon substrate 10 may be done to form a channel stop. If an implant is done, as represented by the arrows 23, the ions will have sufficient energy to penetrate into the silicon substrate 10 but will not have sufficient energy to penetrate the second nitride layer 18, thus the implant will occur only through the opening 20. A third silicon nitride layer 22 is then formed on at least the polysilicon buffer layer 16 exposed in the opening 20. As shown in FIG. 2A, layer 22 may be deposited so as to form over layer 18 and in the opening 20 and may typically have a thickness of between approximately 30 to 500 angstroms.

Figure 3:
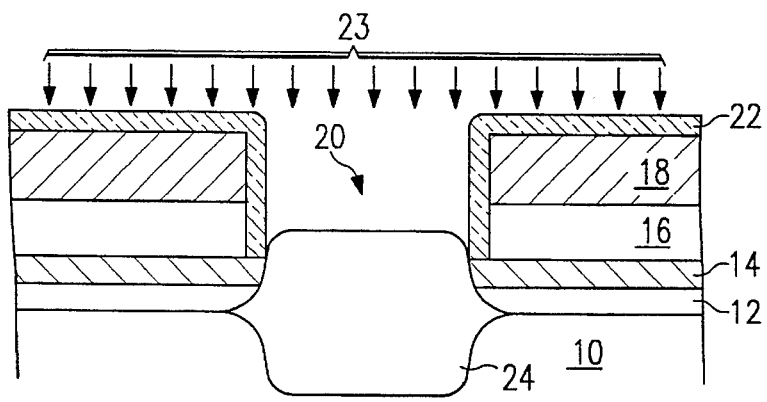

Referring to FIG. 3, the third silicon nitride layer 22, the first silicon nitride layer 14 and the pad oxide layer 12 are etched away in opening 20 to expose the silicon substrate 10. Alternatively, the oxide layer 12 may remain in opening 20. At this stage, if an implant to form a channel stop has not been previously performed, the implant may be done as represented by the arrows 23. Field oxide region 24 is then thermally grown in opening 20 which includes a portion of the silicon substrate 10. If the oxide layer 12 was not etched away, the field oxide region 24 will also include the oxide layer 12 in opening 20.

The polysilicon layer 16 is encapsulated by silicon nitride. The first silicon nitride layer 14 is formed underneath layer 16. A thicker second silicon nitride layer 18 is formed over layer 16 and the third silicon nitride layer 22 is formed on the end of layer 16 exposed in the opening 20. Encapsulating the polysilicon buffer layer 16 in silicon nitride prevents the polysilicon from oxidizing during growth of the field oxide region 24. While the first silicon nitride layer 14 is thin enough so that no additional stress is caused to the silicon substrate, the polysilicon layer 16 acts to relieve stress between the thicker nitride layer 18 and the silicon substrate 10. The polysilicon layer further prevents the thicker nitride layer 18 from inducing defects in the silicon substrate.

In addition, penetration of the grown oxide beneath the nitride layer 14 is reduced. The bird's beak area is thus substantially reduced due to the inability of the polysilicon to oxidize during the growth of the field oxide region. The nitride layers and the polysilicon buffer layer may then be removed to expose the active areas underneath.

Figure 4:
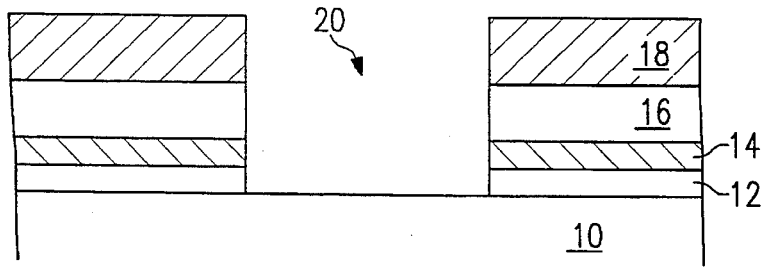

Referring to FIG. 4, an alternative to the above process is shown. The same process steps are followed as shown in FIG. 1. An opening 20 is then etched through the second silicon nitride layer 18, the polysilicon layer 16, the first silicon nitride layer 14 and the oxide layer 12, if desired. The third silicon nitride layer 22, shown in FIG. 2 is not deposited.

Figure 5:
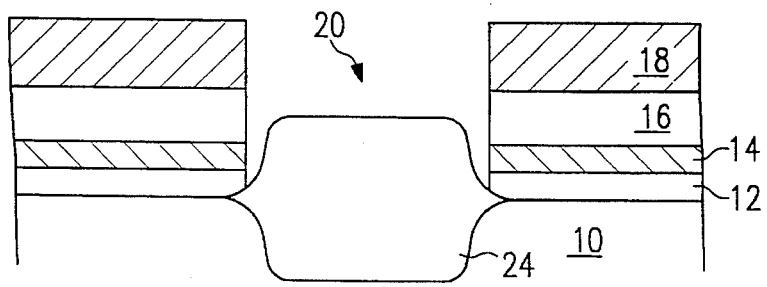

Referring to FIG. 5, field oxide region 24 is then grown in opening 20. The alternative process using a nitride barrier layer 14 under the polysilicon layer 16 performs the same function as the process which also uses the nitride sidewall as described above in FIG. 3. That is, penetration of the grown oxide beneath the nitride layer 14 is reduced thus reducing the bird's beak effect. Moreover, as the field oxide region 24 is grown, the pit formation caused in the polysilicon is not transferred to the oxide underlying the nitride layer 14.

The bird's beak reduction in the alternative process is substantially greater than in the conventional LOCOS process but is less than can be achieved through the use of the nitride sidewall. However, not using a nitride sidewall reduces the stress caused between the silicon nitride at the edge of the active area and the underlying substrate during formation of the field oxide region. When the nitride sidewall is present, the stress is caused between the nitride sidewall and the substrate due to the different thermal coefficients of the two different materials. This alternative process without the nitride sidewall is also much simpler to manufacture. A silicon nitride sidewall does not have to be formed and etched away in the bottom of the opening 20.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor integrated circuit, comprising:

a substrate having a planar upper surface;

a pad oxide layer having an opening therethrough disposed over a portion of the substrate;

a first silicon nitride layer disposed over the pad oxide layer, the first silicon nitride having a first thickness;

a polysilicon layer disposed over the first silicon nitride layer;

a second silicon nitride layer disposed over the polysilicon layer, the second silicon nitride layer having a second thickness greater than the first thickness;

wherein the first and second nitride layers and the polysilicon layer have vertical sidewalls aligned with sidewalls of the opening through the pad oxide layer;

a third silicon nitride layer disposed along the vertical sidewalls of the polysilicon layer and the second silicon nitride layer, such third silicon nitride layer having a thickness less than approximately 500 angstroms; and a field oxide region in the opening, wherein the field oxide extends approximately an equal distance above and below the substrate upper surface.

2. The structure of claim 1, wherein the second thickness is at least approximately 2.5 times as thick as the first thickness.

3. The structure of claim 1, wherein the second thickness is at least approximately 10 times as thick as the first thickness.

4. The structure of claim 1, wherein the first thickness is between approximately 10 and 200 angstroms, and the second thickness is between approximately 500 and 3000 angstroms.

5. The structure of claim 1, wherein the third silicon nitride layer also extends along the sidewalls of the first silicon nitride layer.

* * * * *